United States Patent
Li et al.

(10) Patent No.: US 12,234,325 B2
(45) Date of Patent: Feb. 25, 2025

(54) RESIN COMPOSITION, PREPREG, LAMINATE, METAL FOIL-CLAD LAMINATE, AND PRINTED CIRCUIT BOARD

(71) Applicant: Shengyi Technology Co., Ltd., Guangdong (CN)

(72) Inventors: Hongjie Li, Guangdong (CN); Junqi Tang, Guangdong (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 648 days.

(21) Appl. No.: 17/614,169

(22) PCT Filed: May 31, 2019

(86) PCT No.: PCT/CN2019/089557
§ 371 (c)(1),
(2) Date: Nov. 24, 2021

(87) PCT Pub. No.: WO2020/237634
PCT Pub. Date: Dec. 3, 2020

(65) Prior Publication Data
US 2022/0227942 A1    Jul. 21, 2022

(51) Int. Cl.
*C08G 73/10* (2006.01)
*C08L 63/00* (2006.01)
*C08L 67/02* (2006.01)

(52) U.S. Cl.
CPC .......... *C08G 73/1078* (2013.01); *C08L 63/00* (2013.01); *C08L 67/02* (2013.01); *C08L 2205/035* (2013.01)

(58) Field of Classification Search
CPC ..... C08G 73/1078; C08L 63/00; C08L 67/02; C08L 2205/035
See application file for complete search history.

(56) References Cited

FOREIGN PATENT DOCUMENTS

| | | |
|---|---|---|
| CN | 103992621 A | 8/2014 |
| CN | 109810467 A | 5/2019 |
| CN | 110218415 A | 9/2019 |
| JP | 2010090238 A | 4/2010 |
| JP | 2013234328 A | 11/2013 |
| JP | 2018165340 A | * 10/2018 |

OTHER PUBLICATIONS

English Translation of JP2018165340 (Year: 2018).*
English Translation of CN 103992621 A (Year: 2014).*
International Search Report issued in PCT/CN2019/089557 on Mar. 4, 2020.

* cited by examiner

*Primary Examiner* — Catherine S Branch
*Assistant Examiner* — Andrea Wu
(74) *Attorney, Agent, or Firm* — NORTON ROSE FULBRIGHT US LLP

(57) ABSTRACT

A resin composition, comprising: a modified maleimide resin (A), an active ester resin (B), and an epoxy resin (C); the modified maleimide resin (A) is obtained by means of reacting a maleimide compound (M) having at least two maleimide groups/molecules with an amine compound (N1) having at least one primary amine group/molecule and an amine compound (N2) having at least two primary amine groups/molecules, and the molecular weight distribution is: molecules having a molecular weight between 1000 and 4500 account for 25-60% the total number of molecules.

18 Claims, No Drawings

RESIN COMPOSITION, PREPREG, LAMINATE, METAL FOIL-CLAD LAMINATE, AND PRINTED CIRCUIT BOARD

CROSS REFERENCE TO RELATED APPLICATION

This application is a national phase under 35 U.S.C. § 371 of International Application No. PCT/CN2019/089557 filed on May 31, 2019. The entire contents of this application is incorporated herein by reference in their entirety.

TECHNICAL FIELD

The present disclosure relates to a thermosetting resin, in particular to a resin composition and a prepreg, a laminate, a metal foil-clad laminate and a printed circuit board prepared by using the same.

BACKGROUND

A resin prepreg is often used as a substrate material in a printed circuit board. The substrate material needs to have a low dielectric constant and dielectric loss tangent to be suitable for high-frequency operation signals. Taking the requirements of circuit board processing and use into consideration, the substrate material needs to have good heat resistance. For this reason, a maleimide resin modified with amine groups have been used to prepare the resin prepreg, wherein styrene-maleic anhydride (SMA) is used as a curing agent to achieve good dielectric properties. However, SMA will reduce the peel strength of the resin prepreg and the metal foil, and lead to the disadvantages of increased water absorption, increased brittleness, increased coefficient of thermal expansion (CTE), and decreased flame retardancy at the same time.

Active esters have been used as curing agents for epoxy resin reactions. Since there is no secondary hydroxyl generation, an epoxy resin-active ester system has the advantages of low water absorption, good toughness and good dielectric properties. However, the epoxy resin-active ester system has a low glass transition temperature after curing. Therefore, the heat resistance of the epoxy resin-active ester system cannot meet the requirements of high-frequency applications.

There is still a need for resin compositions and resin prepregs having both good dielectric properties and high heat resistance.

SUMMARY

In one aspect, the present disclosure provides a resin composition, comprising:
a modified maleimide resin (A) obtained by means of reacting a maleimide compound (M) having at least two maleimide groups/molecules with an amine compound (N1) having at least one primary amine group/molecule and an amine compound (N2) having at least two primary amine groups/molecules, and has the molecular weight distribution that molecules having a molecular weight between 1000 and 4500 account for 25-60% of the total number of molecules,
an active ester resin (B), and
an epoxy resin (C).
Optionally, the maleimide compound (M) having at least two maleimide groups/molecules is a compound represented by the Formula (M-1),

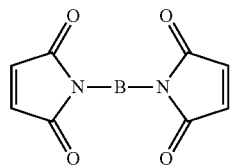

wherein, B is

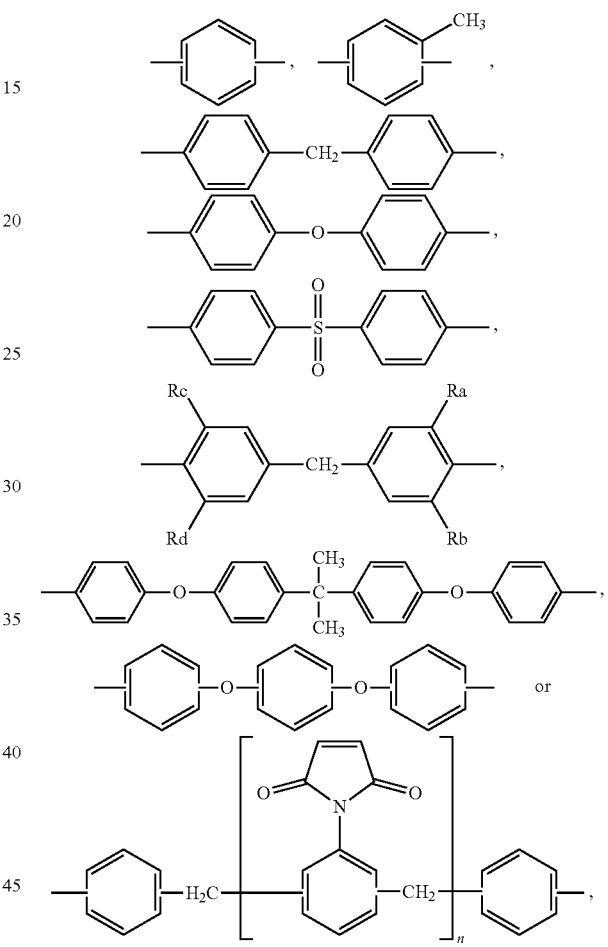

wherein, $R_a$, $R_b$, $R_c$ and $R_d$ are each independently methyl, ethyl, propyl and isopropyl, and n is an integer from 1 to 3.

Optionally, the compound represented by the Formula (M-1) is 2,2-bis(4-(4-maleimidophenoxy)-phenyl)propane, bis(3,5-dimethyl-4-maleimidophenyl)methane, bis(3-ethyl-5-methyl-4-maleimidophenyl)methane or bis(3,5-diethyl-4-maleimidophenyl)methane.

Optionally, the amine compound (N1) having at least one primary amine group/molecule is a compound represented by the Formula (N-1),

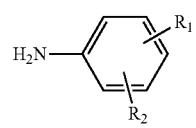

wherein, $R_1$ represents a hydrogen atom or an alkyl group having a carbon number of 1 to 3, and $R_2$ represents an acid group.

Optionally, the compound represented by the Formula (N-1) is p-aminophenol.

Optionally, the amine compound (N2) having at least two primary amine groups/molecules is a compound represented by the Formula (N-2),

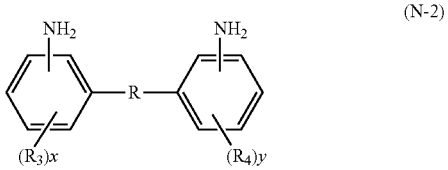

wherein, R represents an aliphatic hydrocarbon group with a carbon number of 1 to 5, —O—,

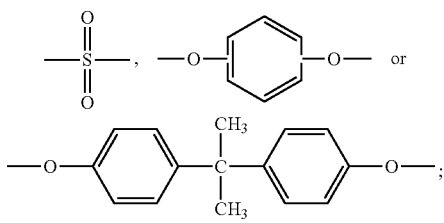

$R_3$ and $R_4$ each independently represent a hydrogen atom, an alkyl group having a carbon number of 1 to 3, a halogen atom, a hydroxyl group, a carboxyl group or a sulfonic acid group; and x and y are each independently an integer from 0 to 4.

Optionally, the compound represented by the Formula (N-2) is 4,4'-diaminodiphenyl ether, 2,2-bis(4-(4-aminophenoxy)-phenyl)propane, 4,4'-diamino-3,3'-dimethyldiphenylmethane, 4,4'-diamino-3,3'-diethyldiphenyl-methane or 4,4'-diamino-3,3'-diethyl-5,5'-dimethyldiphenylmethane.

Optionally, the active ester resin (B) is selected from the group consisting of the compounds represented by the Formula (AR-1) or (AR-2), or a combination thereof,

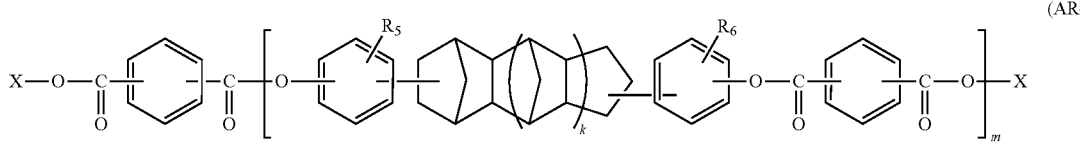

in the Formula (AR-1), X is a benzene ring or a naphthalene ring; $R_5$ and $R_6$ are each independently a methyl group or a hydrogen atom; k is 0 or 1; and m has an equivalent between 0.2 and 2;

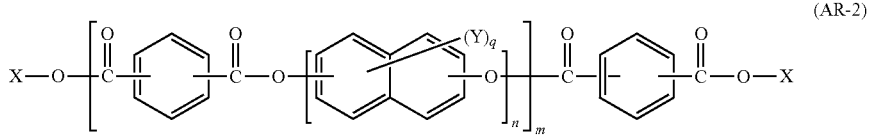

in the Formula (AR-2), X is a benzene ring or a naphthalene ring; Y in $(Y)_q$ is each independently a methyl group, a hydrogen atom or an ester group; q is an integer from 1 to 3; n is an integer from 1 to 10; and m is an integer from 1 to 10.

Optionally, the epoxy resin (C) is selected from an epoxy resin containing at least two epoxy groups.

Optionally, the epoxy resin (C) is a linear novolac epoxy resin, a cresol novolac epoxy resin, a naphthalene epoxy resin, a naphthol epoxy resin, a naphthalene phenolic epoxy resin, a biphenyl epoxy resin, a dicyclopentadiene epoxy resin, a dicyclopentadiene novolac epoxy resin, an aralkyl epoxy resin, an aralkyl novolac epoxy resin, an epoxy resin containing arylene ether structure, or mixtures thereof.

Optionally, the resin composition further comprises a flame retardant (D), an inorganic filler (E), or a combination thereof.

Optionally, the modified maleimide resin (A) is in an amount of 10-70 parts by weight, preferably 20-60 parts by weight, based on the total weight of the modified maleimide resin (A), the active ester resin (B) and the epoxy resin (C) as 100 parts by weight.

Optionally, the active ester resin (B) is in an amount of 5-50 parts by weight, preferably 10-45 parts by weight, based on the total weight of the modified maleimide resin (A), the active ester resin (B) and the epoxy resin (C) as 100 parts by weight.

Optionally, the epoxy resin (C) active ester resin (B) is in an amount of 10-60 parts by weight, preferably 20-50 parts by weight, based on the total weight of the modified maleimide resin (A), the active ester resin (B) and the epoxy resin (C) as 100 parts by weight.

In another aspect, the present disclosure provides a prepreg obtained by impregnating or coating a base material with the resin composition above and curing.

In another aspect, the present disclosure provides a laminate comprising at least one prepreg above.

In another aspect, the present disclosure provides a metal foil-clad laminate comprising at least one prepreg above and metal foils covering one or both sides of the prepreg.

In another aspect, the present disclosure provides a printed circuit board comprising at least one prepreg above.

DETAILED DESCRIPTION

The present disclosure will be described in further detail below in conjunction with embodiments. It will be understood that other embodiments are considered and can be implemented without departing from the scope or spirit of the present disclosure. Therefore, the following detailed description is non-limiting.

Unless otherwise specified, all numbers representing characteristic dimensions, quantities, and physical and chemical properties used in this specification and claims should be understood as being modified by the term "about" in all cases. Therefore, unless otherwise stated, the numerical parameters listed in the above specification and appended claims are approximate values, and those skilled in the art can use the teachings disclosed herein to find the required characteristics and change these approximations appropriately. The use of numerical ranges expressed by endpoints includes all numbers within the range and any range within the range. For example, 1 to 5 includes 1, 1.1, 1.3, 1.5, 2, 2.75, 3, 3.80, 4, and 5, etc.

The present disclosure provides a resin composition, comprising:
  a modified maleimide resin (A) obtained by means of reacting a maleimide compound (M) having at least two maleimide groups/molecules with an amine compound (N1) having at least one primary amine group/molecule and an amine compound (N2) having at least two primary amine groups/molecules, and has the molecular weight distribution that molecules having a molecular weight between 1000 and 4500 account for 25-60% of the total number of molecules,
  an active ester resin (B), and
  an epoxy resin (C).

The modified maleimide resin (A) having a specific structure and a specific molecular weight distribution is used in the resin composition of the present disclosure. The modified maleimide resin (A) is combined with epoxy resin (C) and active ester resin (B) as a curing agent. The cured product has good dielectric properties and heat resistance, and has low water absorption, low coefficient of thermal expansion, high flame retardancy and high bondability with conductors.

The modified maleimide resin (A) of the present disclosure is obtained by reacting a maleimide compound (M) having at least two maleimide groups/molecules with an amine compound (N1) having at least one primary amine group/molecule and an amine compound (N2) having at least two primary amine groups/molecules.

In addition, the modified maleimide resin (A) of the present disclosure has a specific molecular weight distribution. Specifically, the molecules having a molecular weight between 1000 and 4500 account for 25-60% of the total number of molecules. When the proportion of molecules with a molecular weight in this range is less than 25%, the resulting composition has poor peel strength after curing, low glass transition temperature, unqualified moisture-heat resistance, and unqualified processability. When the proportion of molecules with a molecular weight in this range is higher than 60%, the resulting composition has a higher thermal expansion rate and unqualified processability.

Processability means that, on the one hand, the modified maleimide resin (A) is easy to crystallize after modification when the molecules with a molecular weight between 1000 and 4500 account for less than 25% of the total number of molecules, resulting in poor storage stability of the resin; on the other hand, when the molecular weight of the modified maleimide resin (A) with a molecular weight between 1000 and 4500 accounts for more than 60% of the total number of molecules, the viscosity of the modified maleimide resin (A) after modification is too high to fully impregnate the glass cloth to form a prepreg having a good appearance.

Another essential component of the present disclosure is the active ester resin (B). The active ester resin (B) refers to a compound containing one or more active ester groups in the molecule. Active ester resins have been used as curing agents in epoxy resin systems. However, active ester resins typically have no compatibility with maleimide resins and have not been used for curing of maleimide resins. The compatibility referred to in the present disclosure means that, on the one hand, the unmodified maleimide resin and the active ester resin are difficult to achieve co-curing, and bimodal or multimodal will appear after curing in the glass transition temperature (Tg) curve of the mixture containing the two; on the other hand, when blending modified or unmodified maleimide resin with active ester resin, one of the two components will precipitate and agglomerate or form a turbid resin solution, so that the phenomenon of a uniform system cannot be formed.

The inventors of the present disclosure unexpectedly discovered that, when the aforementioned specific modified maleimide resin (A) is selected, it can be co-cured together with the epoxy resin (C) and the active ester resin (B). Compared with the cured product using only epoxy resin and active ester resin, the cured product has a high glass transition temperature, low coefficient of thermal expansion, high heat resistance, and excellent dielectric properties, peel strength, moisture-heat resistance, etc.

The maleimide compound (M) having at least two maleimide groups/molecules described in the present disclosure is not particularly limited, and is selected from the compounds containing at least two maleimide groups in the molecular structure.

Optionally, the maleimide compound (M) having at least two maleimide groups/molecules is a compound represented by the Formula (M-1),

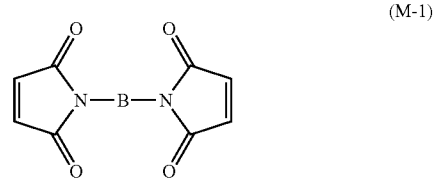

(M-1)

wherein, B is

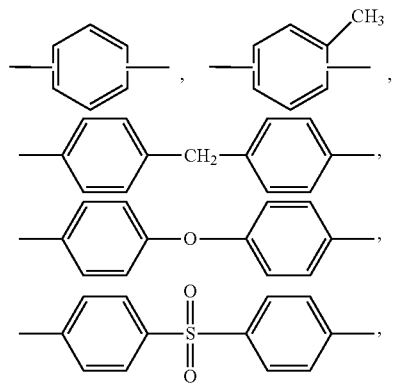

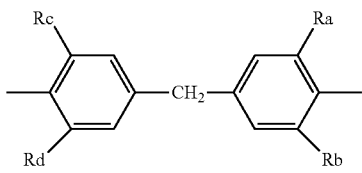

($R_a$, $R_b$, $R_c$ and $R_d$ are each independently methyl, ethyl, propyl or isopropyl),

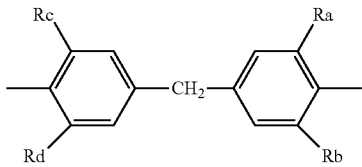

(n is an integer from 1 to 3).

Wherein, preferably B is

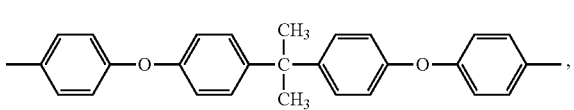

($R_a$, $R_b$, $R_c$ and $R_d$ are each independently methyl and ethyl),

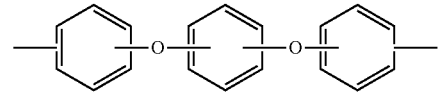 or

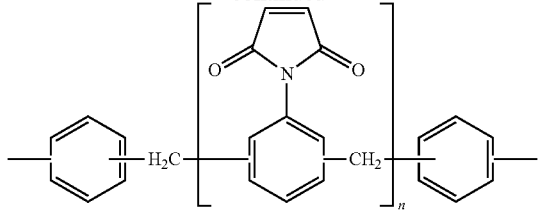

(n is an integer from 1 to 3).

As the compound of M1, for example, may be bis(4-maleimidophenyl)methane, bis(4-maleimidophenyl)ether, bis(4- maleimidophenyl)sulfone, bis(4-maleimidophenyl) sulfide, bis(4-maleimidophenyl)ketone, 4-methyl-1,3-phenylenebismaleimide, m-phenylene-bismaleimide, 1,3-bis(3-maleimidophenoxy)benzene, 1,3-bis(4-maleimidophenoxy) benzene, 2,2-bis(4-(4-maleimidophenoxy)-phenyl)propane, bis(4-(4-maleimidophenoxy)-phenyl)sulfone, bis(3,5-dimethyl-4-maleimidophenyl)-methane, bis(3-ethyl-5-methyl-4-maleimidophenyl)methane, bis(3,5-diethyl-4- maleimidophenyl)methane, polyphenylmethane maleimide.

They may be used alone, or in combination of two or more as needed. Among them, bis(4-maleimidophenyl)methane, bis(4-maleimidophenyl)ether, bis(4-maleimidophenyl) sulfone, 1,3-bis(3-maleimidophenoxy)benzene, 1,3-bis(4-maleimidophenoxy)benzene, 2,2-bis(4-(4-maleimidophenoxy)-phenyl)-propane, bis(4-(4-maleimidophenoxy)-phenyl)sulfone, bis(3,5-dimethyl-4)-maleimidophenyl) methane, bis(3-ethyl-5-methyl-4-maleimidophenyl) methane, bis(3,5-diethyl-4-maleimidophenyl)methane and polyphenylmethane maleimide are preferred. From the viewpoint of being cheaper, bis(4-maleimidophenyl)methane is more preferred. From the viewpoint of excellent reaction characteristics and heat resistance, bis(4-maleimidophenyl)methane, bis(4-maleimidophenyl)ether, bis(4-maleimidophenyl)sulfone, 1,3-bis(3-maleimidophenoxy)benzene, 1,3-bis(4-maleimidophenoxy)benzene, 2,2-bis(4-(4-maleimidophenoxy)-phenyl)propane, bis(4-(4-maleimidophenoxy)-phenyl)sulfone and polyphenylmethane maleimide are more preferred. From the viewpoint of better dielectric properties and lower water absorption, 2,2-bis-(4-(4-maleimidophenoxy)-phenyl)propane, bis(3,5-dimethyl-4- maleimido-phenyl)methane, bis (3-ethyl-5-methyl-4-maleimidophenyl)methane and bis(3,5-diethyl-4-maleimidophenyl) methane are more preferred.

The amine compound (N1) having at least one primary amine group/molecule described in the present disclosure is not particularly limited, and is selected from the compounds containing at least one primary amine group in the molecular structure.

Optionally, the amine compound (N1) having at least one primary amine group/molecule is a compound represented by the Formula (N-1), (N-1)

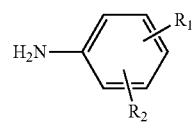

wherein, $R_1$ represents a hydrogen atom or an alkyl group having a carbon number of 1 to 3; $R_2$ represents an acid group which includes but is not limited to hydroxyl, carboxyl and sulfonic acid groups. Wherein, preferably $R_1$ is an H atom or an alkyl group having a carbon number of 1 to 3; and $R_2$ is a hydroxyl group. It is particularly preferable that $R_1$ is an H atom, and $R_2$ is a hydroxyl group.

Examples of the compound of N-1 include o-aminophenol, m-aminophenol, and p-aminophenol. Among them, m-aminophenol and p-aminophenol are preferred from the viewpoints of the reaction yield during the production of modified maleimide and the heat resistance during formation of the resin composition, prepreg and laminate. From the viewpoint of low dielectric, p-aminophenol is particularly preferred.

The amine compound (N2) having at least two primary amine groups/molecules described in the present disclosure is not particularly limited, and is selected from the compounds containing at least two primary amine groups in the molecular structure.

Optionally, the amine compound (N2) having at least two primary amine groups/molecules is a compound represented by the Formula (N-2)

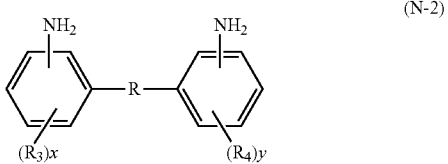

(N-2)

wherein R represents an aliphatic hydrocarbon group with a carbon number of 1 to 5 (aliphatic hydrocarbon groups include methylene, ethylene, propylene, vinylene, etc.), —O—,

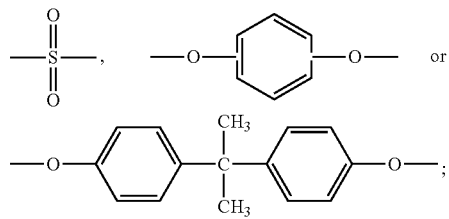

$R_3$ and $R_4$ each independently represent alkyl group having a carbon number of 1 to 3, halogen atom, hydroxyl group, carboxyl group or a sulfonic acid group; and x and y are each independently an integer from 0 to 4.

As the compound of N-2, for example, may be 4,4'-diaminodiphenylmethane, 4,4'-diamino-3,3'-dimethyldiphenylmethane, 4,4'-diamino-3,3'-diethyldiphenylmethane, 4,4'-diamino-3,3'-diethyl-5,5'-dimethyldiphenyl methane, 4,4'-diaminodiphenylether, 4,4'-diaminodiphenylsulfone, 3,3'-diaminodiphenylsulfone, 4,4'-diaminobenzophenone, 4,4'-diaminodiphenyl, 3,3'-dimethyl-4,4'-diaminobiphenyl, 2,2'-dimethyl-4,4'-diaminobiphenyl, 3,3'-dihydroxybenzidine diamine, 2,2-bis(3-amino-4-hydroxyphenyl)propane, 3,3'-dimethyl-5,5'-diethyl-4,4'-diphenylmethanediamine, 2,2-bis(4-aminophenyl)propane, 2,2-bis-(4-(4-aminophenoxy)-phenyl)propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis(1-4-(4-aminophenoxy)phenyl)-1-methylethyl)benzene, 1,4-bis(1-4-(4-aminophenoxy)phenyl)-1-methylethyl)benzene, 4,4-[1,3-phenylenebis(1-methylethylene)]dianiline, 4,4'-[1,4-phenylenebis(1-methylethylene)]dianiline, 3,3'-[1,3-phenylenebis(1-methylethylene)]dianiline, bis(4-(4-aminophenoxy)phenyl)sulfone, bis(4-(3-aminophenoxy)phenyl)sulfone, 9,9-bis(4-aminophenyl)fluorene, etc.

They may be used alone, or in combination of two or more as needed. Among them, from the viewpoint of high solubility in organic solvents, high reaction rate during synthesis, and improved heat resistance, 4,4'-diaminodiphenylether and 4,4'-diaminodiphenylmethane, 4,4'-diamino-3,3'-dimethyldiphenylmethane, 4,4'-diamino-3,3'-diethyldiphenylmethane, 4,4'-diamino-3,3'-diethyl-5,5'-dimethyldiphenylmethane, 2,2-bis(4-(4-aminophenoxy)-phenyl)propane, 4,4'-[1,3-phenylenebis(1-methylethylene)]dianiline and 4,4'-[1,4-phenylenebis(1-methylethylene)]dianiline are preferred. From the viewpoints of excellent solubility, reaction rate, heat resistance and low cost, 4,4'-diaminodiphenylether, 4,4'-diaminodiphenylmethane, 4,4'-diamino-3,3'-dimethyldiphenylmethane, 4,4'-diamino-3,3'-diethyldiphenylmethane and 4,4'-diamino-3,3'-diethyl-5,5'-dimethyldiphenylmethane are more preferred. From the viewpoint of excellent dielectric properties, 4,4'-diaminodiphenyl ether, 2,2-bis(4-(4-aminophenoxy)-phenyl)propane, 4,4'-diamino-3,3'-dimethyldiphenylmethane, 4,4'-diamino-3,3'-diethyldiphenylmethane and 4,4'-diamino-3,3'-diethyl-5,5'-dimethyldiphenylmethane are particularly preferred.

The modification reaction of the modified maleimide resin (A) is preferably carried out in an organic solvent. The organic solvent used in the reaction of the maleimide compound (M) having at least two maleimide groups/molecules with the amine compound (N1) with at least one primary amine group/molecule and the amine compound (N2) with at least two primary amine groups/molecules is not particularly limited. Examples thereof include ethanol, propanol, and butanol, ethylene glycol monomethyl ether, propylene glycol methyl ether and other alcohol solvents; acetone, methyl ethyl ketone, methyl isobutyl ketone, cyclohexanone and other ketone solvents; propylene glycol methyl ether acetate, ethylene glycol methyl ether acetate, methoxyethyl acetate, ethoxyethyl acetate, butoxyethyl acetate and other ester solvents; toluene, xylene, trimethylbenzene and other aromatic solvents; N,N-dimethylformaldehyde, N,N-dimethylacetamide, N-methyl-2-pyrrolidone and other solvents containing nitrogen atoms; and dimethyl sulfoxide and other solvents containing sulfur atoms. These solvents may be used alone or in combination of two or more.

Wherein, from the viewpoint of solubility, cyclohexanone, ethylene glycol monomethyl ether, propylene glycol methyl ether, N,N-dimethylformamide, N,N-dimethylacetamide are preferred; and from the viewpoint of low toxicity, high volatility and resistance to residues, cyclohexanone and propylene glycol methyl ether are particularly preferred.

The ratio of the maleimide compound (M) having at least two maleimide groups/molecules to the amine compound (N1) having at least one primary amine group/molecule and the amine compound (N2) having at least two primary amine groups/molecules used is not particularly limited. The equivalent ratio Em/(En1+En2) of the maleimide group equivalent (Em) of the maleimide compound (M) to the primary amine group equivalent (En 1) of the amine compound (N1) and the primary amine group equivalent (En2) of the amine compound (N2) is preferably in the range of $1.0<Em/(En1+En2)<10.0$, more preferably $2.0<Em/(En1+En2)<9.0$. By setting the equivalent ratio Em/(En1+En2) within the above range, a thermosetting resin composition with excellent storage stability, solubility in organic solvents, copper foil adhesion, dielectric properties, viscosity, and heat resistance can be obtained.

The ratio of the amine compound (N1) with at least one primary amine group/molecule and the amine compound (N2) with at least two primary amine groups/molecules used is not particularly limited. The equivalent ratio En1/En2 of the primary amino group equivalent weight (En1) of the amine compound (N1) to the primary amino group equivalent weight (En2) of the amine compound (N2) is preferably in the range of 1.0<En1/En2<10.0.

An amount of the organic solvent used in the modification reaction of the modified maleimide resin (A) is not particularly limited. Based on 100 parts by weight of the sum of the maleimide compound (M) and the amine compound (N1) and the amine compound (N2), the organic solvent is preferably in an amount of 10 to 1000 parts by weight, more preferably 100 to 500 parts by weight, and particularly preferably 200 to 500 parts by weight. By setting the amount of the organic solvent in the above range, the solubility and the reaction can be made more sufficient.

The modification reaction temperature and time of the modified maleimide resin (A) are not particularly limited, and the reaction temperature and time of the modified maleimide resin (A) can be adjusted according to the requirements on the molecular weight distribution in the present disclosure. From the viewpoint of storage stability and gelation controlling, it is preferable that the reaction temperature ranges from 50 to 200° C.; the reaction time ranges from 0.5 to 10 hours. More preferably, the reaction temperature ranges from 100 to 160° C., and the reaction time ranges from 1 to 8 hours to synthesize the modified maleimide resin (A).

From the viewpoints of storage stability, compatibility and heat resistance, the molecules of the modified maleimide resin (A) having a molecular weight of 1,000 to 4500 preferably account for 30%-50% of the total number of molecules. The molecular weight distributions in the present disclosure are all values measured by the gel permeation chromatography (GPC) method (standard polystyrene calibration).

In the reaction process of the modified maleimide resin (A), any reaction catalyst may or may not be used as needed. As examples of reaction catalysts, may be, amines such as triethylamine, pyridine, and tributylamine, imidazoles such as methylimidazole and phenylimidazole, and organophosphorus catalysts such as triphenylphosphine. These may be used alone or in combination of two or more as necessary. A reaction method of the modified maleimide resin (A) is not particularly limited. For example, a reaction device with a stirrer and a reflux condenser can be used to react while refluxing, to prepare the modified maleimide resin (A).

An amount of the modified maleimide resin (A) is not particularly limited. Based on 100 parts by weight of the total weight of the modified maleimide resin (A), the active ester resin (B) and the epoxy resin (C), it is preferable that the modified maleimide resin (A) is in an amount of 10-70 parts by weight, e.g. 12, 15, 21, 26, 32, 37, 45, 52, 63, 67 parts by weight, further preferably 20-60 parts by weight.

The active ester resin (B) described in the present disclosure is not particularly limited, as long as it contains more than one active ester group in the molecule.

Optionally, the active ester resin (B) is selected from the group consisting of the compounds represented by the Formula (AR-1) or Formula (AR-2), or a combination thereof.

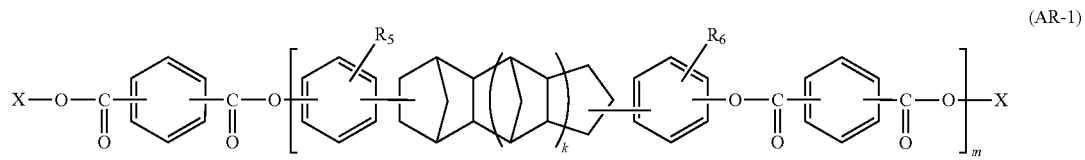

(AR-1)

In the Formula (AR-1), X is a benzene ring or a naphthalene ring; $R_5$ and $R_6$ are each independently a methyl group or a hydrogen atom; k is 0 or 1; and m has an equivalent between 0.2 and 2.

A commercially available example of the active ester represented by the formula (AR-1) is HPC-8000-65T manufactured by DIC Corporation.

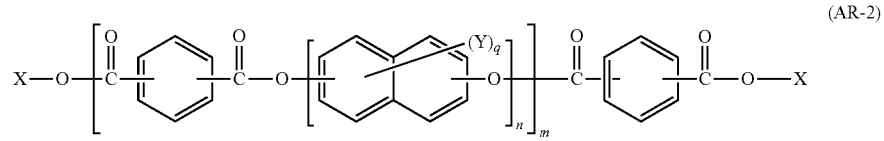

(AR-2)

In the Formula (AR-2), X is a benzene ring or a naphthalene ring; Y in (Y)q is each independently a methyl group, a hydrogen atom or an ester group; q is an integer from 1 to 3; n is an integer from 1 to 10; and m is an integer from 1 to 10.

A commercially available example of the active ester represented by the formula (AR-2) is HPC-8150-62T manufactured by DIC Corporation.

An amount of the active ester resin (B) is not particularly limited. Based on 100 parts by weight of the total weight of the modified maleimide resin (A), the active ester resin (B) and the epoxy resin (C), it is preferable that the active ester resin (B) is in an amount of 5-50 parts by weight, e.g. 7, 13, 16, 22, 25, 33, 37, 45 or 48 parts by weight, further preferably 10-45 parts by weight.

The epoxy resin (C) described in the present disclosure is not particularly limited, which is selected from epoxy resins containing at least two epoxy groups. For example, it can be selected from a bisphenol-A epoxy resin, a bisphenol-E epoxy resin, abisphenol-F epoxy resin, a tetramethyl bisphenol-F epoxy resin, a bisphenol-M epoxy resin, a bisphenol-P epoxy resin, a bisphenol-S epoxy resin, a bisphenol-Z Epoxy resin, a bisphenol-AP epoxy resin, a bisphenol-TMC epoxy resin, a liner novolac epoxy resin, a cresol novolac epoxy resin, a bisphenol-A novolac epoxy resin, a trifunctional phenol epoxy resin, a tetrafunctional phenol epoxy resin, a naphthalene epoxy resin, a naphthol epoxy resin, a naphthol novolac epoxy resin, an anthracene epoxy resin, a phenolphthalein epoxy resin, a phenoxy epoxy resin, a norbornene epoxy resin, an adamantane epoxy resin, a fluorene epoxy resin, a biphenyl epoxy resin, a tetramethyl biphenyl epoxy resin, a dicyclopentadiene epoxy resin, a dicyclopentadiene novolac epoxy resin, an aralkyl epoxy resin, an aralkyl novolac epoxy resin, an epoxy resin containing arylene ether structure in the molecule, a cycloaliphatic epoxy resin, a polyol epoxy resin, a silicon-containing epoxy resin, a nitrogen-containing epoxy resin, a phosphorus-containing epoxy resin, a glycidylamine epoxy resin, and a glycidyl ester epoxy resin. In order to improve the heat resistance of the resin composition, the epoxy resin (C) described in the present disclosure is further preferably any one or a mixture of at least two of a novolac epoxy resin, a cresol novolac epoxy resin, a naphthalene epoxy resin, a naphthol epoxy resin, a naphthol a novolac epoxy resin, a biphenyl epoxy resin, an aralkyl epoxy resin, an aralkyl novolac epoxy resin, a dicyclopentadiene epoxy resin, a dicyclopentadiene novolac epoxy resin and an epoxy resin containing an arylene ether structure in the molecule. The epoxy resin (C) may be used alone, or in combination of at least two as needed.

An amount of the epoxy resin (C) is not particularly limited. Based on 100 parts by weight of the total weight of the modified maleimide resin (A), active ester resin (B) and epoxy resin (C), it is preferable that the epoxy resin (C) is in an amount of 10-60 parts by weight, e.g. 11, 13, 16, 22, 25, 33, 36, 44, 48, 52 or 57 parts by weight, further preferably 20-50 parts by weight.

The resin composition in the present disclosure further comprises a flame retardant (D), an inorganic filler (E), or a combination thereof.

The flame retardant (D) described in the present disclosure is not particularly limited. Optionally, the flame retardant (D) is a bromine-containing flame retardant or/and a halogen-free flame retardant.

Optionally, the bromine-containing flame retardant may be brominated polycarbonate, brominated polystyrene, polybrominated styrene, polybrominated acrylate, decabromodiphenyl ether, decabromodiphenyl ethane, tetrabromodiphenoxybenzene, bis(tribromophenoxy)ethane, ethylenebistetrabromophthalimide, ethylenedipentabromobenzene and bromine-containing epoxy resins.

Optionally, the halogen-free flame retardant may be a phosphorus-based flame retardant.

Preferably, the flame retardant (D) is a phosphorus-based flame retardant. The phosphorus-based flame retardant can effectively improve the flame retardancy of the resin composition of the present disclosure. The phosphorus-based flame retardant may include a reactive phosphorus-based flame retardant and a non-reactive phosphorus-based flame retardant. For example, an aromatic phosphate, a monosubstituted phosphodiester, an disubstituted phosphinate, a metal salt of disubstituted phosphinic acid, an organic nitrogen-containing phosphorus compound, a cyclic organic phosphorus compound, tris(2,6-dimethylphenyl)phosphine, 10-(2,5-dihydroxyphenyl)-9,10-dihydro-9-oxa-10-phosphinphenanthrene-10-oxide, 2,6-bis(2,6-dimethylphenyl) phosphinobenzene, 10-phenyl-9,10-dihydro-9-oxa-10-phosphin-phenanthrene-10-oxide, a phenoxyphosphazene compound, phosphate, polyphosphate, a phosphorus-containing phenolic resin, a phosphorus-containing epoxy resin, a phosphorus-containing benzoxazine resin, a phosphoric anhydride resin, a phosphorus-containing active ester resin and etc. Among them, from the viewpoint of reliability, it is preferable to use the reactive phosphorus-based flame retardant, such as the reactive phosphorus-containing phenolic resin, the phosphorus-containing epoxy resin, the phosphorus-containing benzoxazine resin, the phosphorus-containing anhydride resin, and the phosphorus-containing active ester resin. From the viewpoint of low dielectric properties, the phosphorus-containing active ester resin is more preferable. From the viewpoint of high adhesiveness and compatibility, it is more preferable to use the reactive phosphorus-containing active ester flame retardant represented by the following formula (D-1).

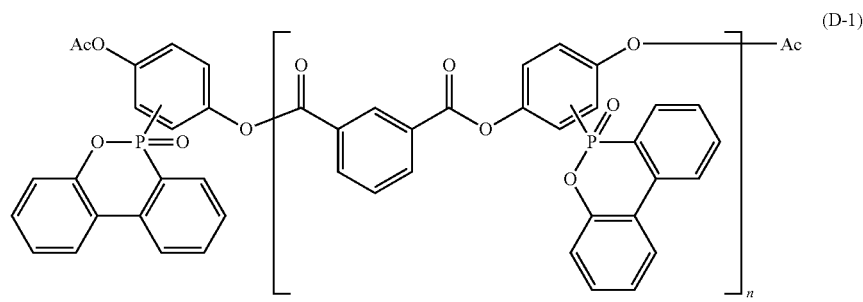

(D-1)

Wherein Ac is an acetyl group, and n is an integer of more than 1. A commercially available example of the flame retardant of the formula (D-1) is PolyQuel™ P100 manufactured by Israel ICL Corporation.

The flame retardant (D) may be used alone, or in combination of at least two as needed.

An amount of the flame retardant (D) is not particularly limited, as long as it meets the flame retardant requirements of the resin composition, the prepreg, the laminate, the metal foil-clad laminate, and the printed circuit board. From the viewpoints of flame retardancy, heat resistance, moisture absorption and dielectric properties, it is preferable that the total phosphorus content in the resin composition is 0.1-5.0 parts by weight, e.g. 0.3, 0.5, 0.8, 1.0, 1.6, 1.8, 2.2, 2.7, 3.3, 3.8, 4.3, 4.7 parts by weight, further preferably 0.5 to 3.0 parts by weight, based on 100 parts by weight of the total weight of the modified maleimide resin (A), the active ester resin (B), the epoxy resin (C) and the flame retardant (D).

The inorganic filler (E) described in the present disclosure is not particularly limited. The inorganic filler (E) may be an inorganic filler known in the prepreg and laminate fields, as long as it does not significantly degrade the performance of the resin composition in the present disclosure. The addition of inorganic filler (E) to the resin composition may achieve a resin composition with more excellent mechanical properties, moisture-heat resistance, flame retardancy, dielectric properties, and coefficient of thermal expansion. The inorganic filler (E) may be selected from any one or a mixture of at least two of silica, metal hydrate, molybdenum oxide, zinc molybdate, titanium oxide, zinc oxide, strontium titanate, barium titanate, barium sulfate, boron nitride, aluminum nitride, silicon carbide, alumina, zinc borate, zinc stannate, clay, kaolin, talc, mica, composite silica powder, E glass powder, D glass powder, L glass powder, M glass powder, S glass powder, T glass powder, NE glass powder, Q glass powder, quartz glass powder, short glass fiber and hollow glass, preferably any one or a mixture of at least two of crystalline silica, fused silica, amorphous silica, spherical silica, hollow silica, aluminum hydroxide, boehmite, magnesium hydroxide, molybdenum oxide, zinc molybdate, titanium oxide, zinc oxide, strontium titanate, barium titanate, barium sulfate, boron nitride, aluminum nitride, silicon carbide, alumina, zinc borate, zinc stannate, clay, kaolin, talc, mica, composite silica powder, E glass powder, D glass powder, L glass powder, M glass powder, S glass powder, T glass powder, NE glass Powder, Q glass powder, quartz glass powder, short glass fiber and hollow glass. The mixture is, for example, a mixture of crystalline silica and fused silica, a mixture of amorphous silica and spherical silica, a mixture of hollow silica and aluminum hydroxide, a mixture of boehmite and magnesium hydroxide, a mixture of molybdenum oxide and zinc molybdate, a mixture of titanium oxide, zinc oxide, strontium titanate and barium titanate, a mixture of barium sulfate, boron nitride and aluminum nitride, a mixture of silicon carbide, alumina, zinc borate and zinc stannate, a mixture of composite silica powder, E glass powder, D glass powder, L glass powder and M glass powder, a mixture of S glass powder, T glass powder, NE glass Powder and quartz glass powder, a mixture of clay, kaolin, talc and mica, a mixture of short glass fiber and hollow glass, further preferably the fused silica. Wherein, the fused silica is preferably since it has the characteristic of low coefficient of thermal expansion. The inorganic filler (E) is more preferably spherical fused silica. The spherical fused silica is preferable since it has characteristics such as low coefficient of thermal expansion and good dielectric properties, as well as good dispersibility and fluidity.

An average particle size (d50) of the inorganic filler (E) is not particularly limited. From the viewpoint of dispersibility, the average particle size (d50) is preferably 0.1-10 μm, e.g. 0.2, 0.8, 1.5, 2.1, 2.6, 3.5, 4.5, 5.2, 5.5, 6, 6.5, 7, 7.5, 8, 8.5, 9, 9.5 μm, more preferably 0.2-5 μm. Different types of inorganic fillers (E) with different particle size distributions or different average particle diameters may be used alone or in combination as needed.

An amount of the inorganic filler (E) is not particularly limited in the present disclosure. Based on 100 parts by weight of the total weight of the modified maleimide resin (A), the active ester resin (B) and the epoxy resin (C), or of the modified maleimide resin (A), the active ester resin (B), the epoxy resin (C) and the flame retardant (D), the inorganic filler (E) can be in an amount of 10-200 parts by weight, e.g. 20, 40, 60, 80, 100, 120, 140, 160 or 180 parts by weight, preferably 20-150 parts by weight, further preferably 30-100 parts by weight.

The inorganic filler (E) of the present disclosure can be used in combination with a surface treatment agent, a wetting agent, and a dispersing agent. The surface treatment agent is not particularly limited, and it can be selected from commonly used surface treatment agents for the surface treatment of inorganic substances, which are specifically a tetraethyl orthosilicate compound, an organic acid compound, an aluminate compound, a titanate compound, an organosilicon oligomer, a macromolecular treatment agent, a silane coupling agent, etc. There is no particular limitation on the silane coupling agent, and it is selected from silane coupling agents commonly used in the surface treatment of inorganic substances, which are a specifically amino silane coupling agent, an epoxy silane coupling agent, a vinyl silane coupling agent, a phenyl silane coupling agent, a cationic silane coupling agent, a mercaptosilane coupling agent, etc., preferably the amino silane coupling agent, the epoxy silane coupling agent, and the phenyl silane coupling agent, and further preferably the aminosilane coupling agent. There are no particular limitations on the wetting agent and the dispersing agent, which are selected from the wetting agents and dispersing agents commonly used in coatings. In the present disclosure, different types of surface treatment agents, wetting agents, and dispersing agents may be used alone or in appropriate combination as needed.

The resin composition of the present disclosure may further include an organic filler (F). The organic filler (F) is not particularly limited, and can be selected from the group consisting of silicone, liquid crystal polymer, thermosetting resin, thermoplastic resin, rubber and core-shell rubber, or a mixture of at least two selected therefrom. The organic filler (F) may be powder or granules.

The expression "comprising" mentioned in the present disclosure means that, in addition to the aforementioned components, it can also include other components, which impart different characteristics to the resin composition. In addition, the expression "comprising" mentioned in the present disclosure can also be replaced with a closed expression "being" or "consisting of".

The resin composition of the present disclosure can also be used in combination with a maleimide resin other than the modified maleimide resin (A), as long as it does not impair the inherent properties of the resin composition. It may be selected from any one or a mixture of at least two of bis(4-maleimidophenyl)methane, bis(4-maleimidophenyl)ether, bis(4-maleimidophenyl)sulfone, bis(4-maleimidophenyl)sulfide, bis(4-maleimido-phenyl)ketone, 4-methyl-1,3-phenylenebismaleimide, m-phenylene-bismaleimide, 1,3-bis(3-maleimidophenoxy)benzene, 1,3-bis(4-maleimidophenoxy)benzene, 2,2-bis(4-(4-maleimidophenoxy)-phenyl)propane, bis(4-(4-maleimidophenoxy)-phenyl)sulfone, bis(3,5-dimethyl-4-maleimidophenyl)methane, bis(3-ethyl-5-methyl-4-maleimidophenyl)methane, bis(3,5-diethyl-4-maleimidophenyl)methane and polyphenylmethane maleimide. These maleimide resins may be used alone or in combination as needed.

The resin composition of the present disclosure can also be used in combination with various polymers, rubbers, and elastomers, as long as it does not impair the inherent properties of the resin composition. Specific examples may be liquid crystal polymers, thermosetting resins, thermoplastic resins, different flame retardant compounds or additives, etc. The thermosetting resin can be selected from phenolic resins, cyanate ester resins, anhydride compounds, styrene-maleic anhydride copolymer resins, benzoxazine resins, polyphenylene ether resins, silicone resins, allyl resins, amine compounds and dicyclopentadiene resins. They may be used alone or in combination as needed.

The resin composition of the present disclosure can also be used in combination with a curing accelerator as needed to control the curing reaction rate. The curing accelerator is not particularly limited, and it can be selected from curing accelerators commonly used to promote curing of maleimide resins, active ester resins, and epoxy resins, specifically amines such as triethylamine, pyridine and tributylamine amines, imidazoles such as methylimidazole, phenylimidazole and derivatives thereof, organophosphorus accelerators such as triphenylphosphine, etc. They may be used alone or in combination as needed.

In addition, the resin composition may also contain various additives. Specific examples include antioxidants, heat stabilizers, antistatic agents, ultraviolet absorbers, pigments, colorants, lubricants, and the like. These various additives may be used alone or in combination of two or more.

The preparation method of the resin composition in the present disclosure is not specifically limited. As one of the preparation methods of the resin composition in the present disclosure, the modified maleimide resin (A), the active ester resin (B) and the epoxy resin (C) can be compounded, prepolymerized, prereacted, stirred, and mixed by well-known methods.

When the resin composition of the present disclosure is used to form a resin varnish, an organic solvent may be used as needed. The organic solvent is not particularly limited, as long as it is a solvent compatible with the mixture of the modified maleimide resin (A), the active ester resin (B) and the epoxy resin (C). The specific examples of the solvent include alcohol solvents such as ethanol, propanol, butanol, ethylene glycol monomethyl ether and propylene glycol methyl ether; ketone solvents such as acetone, butanone, methyl ethyl ketone, methyl isobutyl ketone and cyclohexanone; ester solvents such as propylene glycol methyl ether acetate, ethylene glycol methyl ether acetate, methoxy ethyl acetate, ethoxy ethyl acetate and butoxy ethyl acetate; aromatic solvents such as toluene, xylene and trimethylbenzene; nitrogen-containing solvents such as N,N-dimethylformamide, N,N-dimethylacetamide and N-methyl-2-pyrrolidone; and sulfur-containing solvents such as dimethyl sulfoxide. These solvents may be used alone or in combination of two or more.

Another object of the present disclosure is to provide a prepreg, a laminate, a metal foil-clad laminate, and a printed circuit board prepared by using the resin composition above. The prepreg obtained by using the resin composition of the present disclosure has good curability. The obtained laminate has good dimensional stability and excellent heat resistance. At the same time, the metal foil-clad laminate obtained from the prepreg has excellent dielectric properties, high flame resistance, good heat resistance, low water absorption, low coefficient of thermal expansion and high bonding properties with conductors, especially suitable as a material for printed circuit boards that require high heat resistance and high multilayers.

The present disclosure provides a prepreg prepared by using the resin composition above. The prepreg includes a substrate and the resin composition as described above attached to the substrate after being impregnated and dried. The base material described in the present disclosure is not particularly limited, and it can be selected from known base materials used to make various printed circuit board materials. Specifically, it is selected from inorganic fibers (glass fibers such as E glass, D glass, L glass, M glass, S glass, T glass, NE glass, Q glass, quartz), organic fibers (such as polyimide, polyamide, polyester, polyphenylene ether, liquid crystal polymer, etc.). The base material is usually in the form of woven fabric, non-woven fabric, roving, short fiber, fiber paper, etc. Among the above base materials, the base material in the present disclosure is preferably glass fiber cloth.

There is no specific limitation on the preparation method of the prepreg described in the present disclosure, as long as it is a method of preparing the prepreg by combining the resin composition in the present disclosure with the base material.

The present disclosure also provides a laminate and a metal foil-clad laminate prepared by using the prepreg above. The laminate includes at least one prepreg as described above, and the overlapped prepreg is laminated and cured to obtain the laminate. The metal foil-clad laminate includes at least one prepreg as described above, and is obtained by coating metal foils onto one or both sides of the laminated prepreg, laminating and curing.

The preparation method of the laminate of the present disclosure is not specifically limited, and it can be prepared by a well-known method, for example, placing a piece of the above-mentioned prepreg or stacking two or more prepregs, placing as needed the metal foil on one or both sides of the prepreg or the stacked prepreg, and laminating and curing to obtain a laminate or a metal foil-clad laminate. The metal foil is not particularly limited, and it can be selected from the metal foil used for the printed circuit board material. The lamination condition can be selected from a general lamination condition for the laminate used for the printed circuit board and the multilayer board.

The present disclosure also provides a printed circuit board, which includes at least one prepreg as described above. The preparation method of the printed circuit board described in the present disclosure is not specifically limited, and it can be prepared by a well-known method.

The present disclosure will be described in more detail below in conjunction with examples. It should be pointed out that these descriptions and examples are intended to facilitate the understanding of the present disclosure, rather than limiting the present disclosure. The protection scope of the present disclosure is subject to the appended claims.

SYNTHESIS EXAMPLE 1 SYNTHESIS OF A MODIFIED MALEIMIDE RESIN A1 OF THE PRESENT DISCLOSURE 30.5 g of 4,4'-diaminodiphenyl ether, 190.0 g of 3,3'-dimethyl-5,5'-diethyl- 4,4'-diphenylmethane bismaleimide, 10.2 g of p-aminophenol, 180 g of N,N-dimethylformamide and 60 g of ethylene glycol monomethyl ether acetate were added into a reaction vessel equipped with a thermometer, a stirring device and a reflux condenser with a volume of 1 L, reacted at 110° C. for 5 hours to obtain a solution of the modified maleimide resin (A1). By using gel permeation chromatography (GPC) to convert from a calibration curve using standard polystyrene, it was determined that molecules with a molecular weight between 1,000 and 4,500 accounted for 38% of the total number of molecules.

SYNTHESIS EXAMPLE 2 SYNTHESIS OF A MODIFIED MALEIMIDE RESIN A2 OF THE PRESENT DISCLOSURE 33.5 g of 4,4'-diaminodiphenyl ether, 190.0 g of 3,3'-dimethyl-5,5'-diethyl- 4,4'-diphenylmethane bismaleimide, 7.2 g of p-aminophenol, 180 g of N,N- dimethylformamide and 60 g of ethylene glycol monomethyl ether acetate were added into a reaction vessel equipped with a thermometer, a stirring device and a reflux condenser with a volume of 1 L, reacted at 110° C. for 5 hours to obtain a solution of the modified maleimide resin (A2). By using gel permeation chromatography (GPC) to convert from a calibration curve using standard polystyrene, it was determined that molecules with a molecular weight between 1,000 and 4,500 accounted for 50% of the total number of molecules.

SYNTHESIS EXAMPLE 3 SYNTHESIS OF A MODIFIED MALEIMIDE RESIN A3 OF THE PRESENT DISCLOSURE 30.5 g of 4,4'-diaminodiphenyl ether, 190.0 g of 2,2-bis(4-(4-maleimido-phenoxy)phenyl)propane, 10.2 g of p-aminophenol, 180 g of N,N-dimethylformamide and 60 g of ethylene glycol monomethyl ether acetate were added into a reaction vessel equipped with a thermometer, a stirring device and a reflux condenser with a volume of 1 L, reacted at 110° C. for 5 hours to obtain a solution of the modified maleimide resin (A3). By using gel permeation chromatography (GPC) to convert from a calibration curve using standard polystyrene, it was determined that molecules with a molecular weight between 1,000 and 4,500 accounted for 38% of the total number of molecules.

SYNTHESIS EXAMPLE 4 SYNTHESIS OF A MODIFIED MALEIMIDE RESIN A4 OF THE PRESENT DISCLOSURE 30.5 g of 4,4'-diaminodiphenyl ether, 190.0 g of bis(4-maleimidophenyl)methane, 10.2 g of p-aminophenol, 180 g of N,N-dimethylformamide and 60 g of ethylene glycol monomethyl ether acetate were added into a reaction vessel equipped with a thermometer, a stirring device and a reflux condenser with a volume of 1 L, reacted at 110° C. for 5 hours to obtain a solution of the modified maleimide resin (A4). By using gel permeation chromatography (GPC) to convert from a calibration curve using standard polystyrene, it was determined that molecules with a molecular weight between 1,000 and 4,500 accounted for 36% of the total number of molecules.

SYNTHESIS EXAMPLE 5 SYNTHESIS OF A MODIFIED MALEIMIDE RESIN A5 OF THE PRESENT DISCLOSURE 30.5 g of 4,4'-diaminodiphenyl ether, 190.0 g of bis(3,5-dimethyl-4-maleimido- phenyl)methane, 10.2 g of p-aminophenol, 180 g of N,N-dimethylformamide and 60 g of ethylene glycol monomethyl ether acetate were added into a reaction vessel equipped with a thermometer, a stirring device and a reflux condenser with a volume of 1 L, reacted at 110° C. for 5 hours to obtain a solution of the modified maleimide resin (A5). By using gel permeation chromatography (GPC) to convert from a calibration curve using standard polystyrene, it was determined that molecules with a molecular weight between 1,000 and 4,500 accounted for 38% of the total number of molecules.

SYNTHESIS EXAMPLE 6 SYNTHESIS OF A MODIFIED MALEIMIDE RESIN A6 OF THE PRESENT DISCLOSURE 30.5 g of 4,4'-diaminodiphenylmethane, 190.0 g of 3,3'-dimethyl-5,5'-diethyl-4,4'-diphenylmethane bismaleimide, 10.2 g of p-aminophenol, 180 g of N,N-dimethylformamide and 60 g of ethylene glycol monomethyl ether acetate were added into a reaction vessel equipped with a thermometer, a stirring device and a reflux condenser with a volume of 1 L, reacted at 110° C. for 5 hours to obtain a solution of the modified maleimide resin (A6). By using gel permeation chromatography (GPC) to convert from a calibration curve using standard polystyrene, it was determined that molecules with a molecular weight between 1,000 and 4,500 accounted for 42% of the total number of molecules.

SYNTHESIS EXAMPLE 7 SYNTHESIS OF A MODIFIED MALEIMIDE RESIN A7 OF THE PRESENT DISCLOSURE 30.5 g of 4,4'-diaminodiphenylmethane, 190.0 g of 3,3'-dimethyl-5,5'-diethyl-4,4'-diphenylmethane bismaleimide, 10.2 g of p-aminophenol, 180 g of N,N-dimethylformamide and 60 g of ethylene glycol monomethyl ether acetate were added into a reaction vessel equipped with a thermometer, a stirring device and a reflux condenser with a volume of 1 L, reacted at 110° C. for 5 hours to obtain a solution of the modified maleimide resin (A7). By using gel permeation chromatography (GPC) to convert from a calibration curve using standard polystyrene, it was determined that molecules with a molecular weight between 1,000 and 4,500 accounted for 40% of the total number of molecules.

SYNTHESIS EXAMPLE 8 SYNTHESIS OF A MODIFIED MALEIMIDE RESIN A8 FOR COMPARISON 25.5 g of 4,4'-diaminodiphenyl ether, 190.0 g of 3,3'-dimethyl-5,5'-diethyl- 4,4'-diphenylmethane bismaleimide, 15.2 g of p-aminophenol, 180 g of N,N-dimethylformamide and 60 g of ethylene glycol monomethyl ether acetate were added into a reaction vessel equipped with a thermometer, a stirring device and a reflux condenser with a volume of 1 L, reacted at 100° C. for 2 hours to obtain a solution of the modified maleimide resin (A8). By using gel permeation chromatography (GPC) to convert from a calibration curve using standard polystyrene, it was determined that molecules with a molecular weight between 1,000 and 4,500 accounted for 20% of the total number of molecules.

SYNTHESIS EXAMPLE 9 SYNTHESIS OF A MODIFIED MALEIMIDE RESIN A9 FOR COMPARISON 38.5 g of 4,4'-diaminodiphenyl ether, 190.0 g of 3,3'-dimethyl-5,5'-diethyl- 4,4'-diphenylmethane bismaleimide, 2.2 g of p-aminophenol, 180 g of N,N-dimethylformamide and 60 g of ethylene glycol monomethyl ether acetate were added into a reaction vessel equipped with a thermometer, a stirring device and a reflux condenser with a volume of 1 L, reacted at 120° C. for 7 hours to obtain a solution of the modified maleimide resin (A9). By using gel permeation chromatography (GPC) to convert from a calibration curve using standard polystyrene, it was determined that molecules with a molecular weight between 1,000 and 4,500 accounted for 65% of the total number of molecules.

SYNTHESIS EXAMPLE 10 SYNTHESIS OF A MODIFIED MALEIMIDE RESIN A10 FOR COMPARISON 38.5 g of 4,4'-diaminodiphenyl ether, 190.0 g of 3,3'-dimethyl-5,5'-diethyl- 4,4'-diphenylmethane bismaleimide, 180 g of N,N-dimethylformamide and 60 g of ethylene glycol monomethyl ether acetate were added into a reaction vessel equipped with a thermometer, a stirring device and a reflux condenser with a volume of 1 L, reacted at 120° C. for 7 hours to obtain a solution of the modified maleimide resin (A10). By using gel permeation chromatography (GPC) to convert from a calibration curve using standard polystyrene, it was determined that molecules with a molecular weight between 1,000 and 4,500 accounted for 70% of the total number of molecules.

SYNTHESIS EXAMPLE 11 SYNTHESIS OF A MODIFIED MALEIMIDE RESIN A11 FOR COMPARISON 190.0 g of 3,3'-dimethyl-5,5'-diethyl-4,4'-diphenylmethane bismaleimide, 15.2 g of p-aminophenol, 180 g of N,N-dimethylformamide and 60 g of ethylene glycol monomethyl ether acetate were added into a reaction vessel equipped with a thermometer, a stirring device and a reflux condenser with a volume of 1 L, reacted at 120° C. for 7 hours to obtain a solution of the modified maleimide resin (A11). By using gel permeation chromatography (GPC) to convert from a calibration curve using standard polystyrene, it was determined that molecules with a molecular weight between 1,000 and 4,500 accounted for 15% of the total number of molecules.

The compositions in Examples 1-16 and Comparative Examples 1-4 were prepared according to the formulas in the following table.

A1-A11 are the modified maleimide resin solutions prepared as above.

B1 is an active ester resin HPC-8000-65T (ester group equivalent=230, manufactured by DIC Corporation).

B2 is an active ester resin HPC-8150-62T (ester group equivalent=200, manufactured by DIC Corporation).

C1 is an epoxy resin HP-7200H (dicyclopentadiene type, manufactured by DIC Corporation).

C2 is an epoxy resin NC-3000-H (biphenyl aralkyl type, manufactured by Nippon Kayaku Co., Ltd.).

C3 is an epoxy resin N-690 (ortho-cresol type, manufactured by DIC Corporation).

D1 is a phosphorus-containing active ester Polyquel™ P100 (manufactured by ICL Corporation, Israel).

D2 is a phosphorus-containing phenolic resin XZ-92741 (manufactured by Olin, USA).

E1 is an angular silica DQ1032A as an inorganic filler (manufactured by Jiangsu Novoray Company).

E2 is a spherical silica SC-2050MB as an inorganic filler (manufactured by Japan Admatechs Corporation).

After the composition was formulated, it was directly dried into a test piece for testing the glass transition temperature. Furthermore, a glass cloth 2116 (0.1 mm) was impregnated with the composition, and dried at 155° C. for 5 minutes to obtain a prepreg. And then, 8 sheets of the prepreg were laminated, double-sided laminated with RTF copper foil having a thickness of 18 μm (manufactured by Mitsui Metals Co., Ltd.), heated and pressurized for 90 minutes at a temperature of 200° C. and a pressure of 25 kgf/cm² (2.45 MPa), to make a copper clad laminate with a thickness of 1.0 mm. After the copper foil of the above-mentioned copper clad laminate was etched to form a copper-free laminate.

The following methods were used to measure and evaluate the relative dielectric constant, peel strength, glass transition temperature, metal foil adhesion, thermal expansion, flame retardancy and processability of copper clad laminates/copper-free laminates. The evaluation methods are as follows. The results are shown in the tables below.

Dielectric Constant (Dk) and Dielectric Loss Factor (Df)

According to a plate capacitor method, the dielectric constant and dielectric loss factor at 1 GHz were tested on the laminate Peel Strength According to an IPC-TM-650 2.4.8 method, the copper clad laminate was measured.

Glass Transition Temperature (Tg)

By using a viscoelasticity measuring device (DMA: solid viscoelasticity measuring device RSAII manufactured by Rheometric Company, Rectangular Tension method, at a frequency of 1 Hz, heating rate of 5° C./min), the temperature at which the change in an elastic modulus reached the maximum (the maximum tans change rate) was measured for the laminate, and this was evaluated as the glass transition temperature.

Coefficient of Thermal Expansion (CTE)

According to an IPC-TM-650 2.4.24 method, the laminate was measured.

Moisture-Heat Resistance

The laminate was placed in a pressure cooker, treated at 120° C., 105 KPa for 3 hours, and then immersed in a tin furnace at 288° C. Recording the corresponding time when the laminate burst in layers. The evaluation could be ended when the copper clad laminate was in the tin furnace for more than 5 minutes without blistering or delamination. No blistering and no delamination were recorded as passing, and blistering or delamination was recorded as failure.

Flame Retardant

According to an UL 94 vertical combustion method, the laminate was measured.

Processability

It is evaluated according to the formability and process controllability of the resin composition. To satisfy the processability, that is, the modified maleimide resin (A) has good storage stability after modification or has a moderate viscosity and can form a prepreg with good appearance, will be recorded as OK, otherwise as not OK.

The data of the Examples and Comparative Examples are shown in Tables 1 to 3 below, respectively.

TABLE 1

| Component | Unit | Examples | | | | | | | |
| --- | --- | --- | --- | --- | --- | --- | --- | --- | --- |
| | | 1 | 2 | 3 | 4 | 5 | 6 | 7 | 8 |
| (A1) | Weight percent | 20 | 35 | 55 | 45 | 30 | 35 | 35 | 35 |
| (A2) | Weight percent | | | | | | | | |
| (B1) | Weight percent | 30 | 35 | 25 | 30 | 40 | | 35 | |
| (B2) | | | | | | | 35 | | |
| (C1) | Weight percent | 50 | 30 | 20 | 35 | 30 | 30 | | |
| (C2) | Weight percent | | | | | | | 30 | |
| (C3) | Weight percent | | | | | | | | 30 |
| (D1) | Phosphorus | 0 | 1 | 1 | 1 | 1 | 1 | 1 | 1 |

TABLE 1-continued

| Component | Unit | Examples 1 | 2 | 3 | 4 | 5 | 6 | 7 | 8 |
|---|---|---|---|---|---|---|---|---|---|
| (D2) | Phosphorus content % | | | | | | | | |
| (E1) | Weight percent | 0 | 50 | 70 | 50 | 50 | 50 | 50 | 50 |
| (E2) | Weight percent | | | | | | | | |
| Dk/Df (1 GHz) | — | 3.6/0.006 | 3.7/0.004 | 3.8/0.006 | 3.7/0.005 | 3.7/0.005 | 3.7/0.005 | 3.9/0.006 | 3.7/0.004 |
| Peel strength | N/mm | 1.4 | 1.2 | 1.3 | 1 | 1 | 1.1 | 1.2 | 1.3 |
| Glass transition temperature | °C | 226 | 220 | 235 | 227 | 223 | 225 | 216 | 215 |
| Coefficient of thermal expansion | ppm/°C | 40 | 30 | 25 | 20 | 31 | 26 | 40 | 45 |
| Moisture-heat resistance | — | Pass | Pass | Pass | Pass | Pass | Pass | Pass | Pass |
| Flame retardant | — | V-1 | V-0 | V-0 | V-0 | V-0 | V-0 | V-0 | V-0 |
| Processibility | — | OK | OK | OK | OK | OK | OK | OK | OK |

TABLE 2

| | Unit | Examples 9 | 10 | 11 | 12 | 13 | 14 | 15 | 16 |
|---|---|---|---|---|---|---|---|---|---|
| (A1) | Weight percent | 35 | 35 | | | | | | |
| (A2) | Weight percent | | | 35 | | | | | |
| (A3) | Weight percent | | | | 35 | | | | |
| (A4) | Weight percent | | | | | 35 | | | |
| (A5) | Weight percent | | | | | | 35 | | |
| (A6) | Weight percent | | | | | | | 35 | |
| (A7) | Weight percent | | | | | | | | 35 |
| (B1) | Weight percent | 35 | 35 | 35 | 35 | 35 | 35 | 35 | 35 |
| (B2) | | | | | | | | | |
| (C1) | Weight percent | 30 | 30 | 30 | 30 | 30 | 30 | 30 | 30 |
| (C2) | Weight percent | | | | | | | | |
| (C3) | Weight percent | | | | | | | | |
| (D1) | Phosphorus content % | | 1 | 1 | 1 | 1 | 1 | 1 | 1 |
| (D2) | Phosphorus content % | 1 | | | | | | | |
| (E1) | Weight percent | 50 | | 50 | 50 | 50 | 50 | 50 | 50 |
| (E2) | Weight percent | | 50 | | | | | | |
| Dk/Df (1 GHz) | — | 4.0/0.007 | 3.7/0.004 | 3.8/0.005 | 3.9/0.005 | 3.7/0.004 | 3.8/0.005 | 4.0/0.007 | 3.7/0.004 |
| Peel strength | N/mm | 1.1 | 1.2 | 1.1 | 1.3 | 1.2 | 1.2 | 1.0 | 1.2 |
| Glass transition temperature | °C | 217 | 220 | 216 | 231 | 228 | 226 | 235 | 230 |
| Coefficient of thermal expansion | ppm/°C | 47 | 28 | 35 | 35 | 28 | 35 | 30 | 28 |
| Moisture-heat resistance | — | Pass | Pass | Pass | Pass | Pass | Pass | Pass | Pass |

TABLE 2-continued

| | Unit | Examples | | | | | | | |
| --- | --- | --- | --- | --- | --- | --- | --- | --- | --- |
| | | 9 | 10 | 11 | 12 | 13 | 14 | 15 | 16 |
| Flame retardant | — | V-0 | V-0 | V-0 | V-0 | V-0 | V-0 | V-0 | V-0 |
| Processibility | — | OK | OK | OK | OK | OK | OK | OK | OK |

TABLE 3

| | Unit | Comparative Examples | | | |
| --- | --- | --- | --- | --- | --- |
| | | 1 | 2 | 3 | 4 |
| (A8) | Weight percent | 35 | | | |
| (A9) | Weight percent | | 35 | | |
| (A10) | Weight percent | | | 35 | |
| (A11) | Weight percent | | | | 35 |
| (B1) | Weight percent | 35 | 35 | 35 | 35 |
| (C1) | Weight percent | 30 | 30 | 30 | 35 |
| (D1) | Phosphorus content % | 1 | 1 | 1 | 1 |
| (E1) | Weight percent | 50 | 50 | 50 | 50 |
| Dk/Df(1 GHz) | — | 4.0/0.007 | 3.9/0.007 | 4.0/0.006 | 4.2/0.009 |
| Peel strength | N/mm | 0.83 | 0.91 | 0.85 | 1.3 |
| Glass transition temperature | °C. | 213 | 210 | 205 | 225 |
| Coefficient of thermal expansion | ppm/°C. | 55 | 60 | 55 | 35 |
| Moisture-heat resistance | — | Failure | Failure | Failure | Failure |
| Flame retardant | — | V-0 | V-0 | V-0 | V-0 |
| Processibility | — | Not OK | Not OK | OK | OK |

The resin compositions in Examples 1-16 of the present disclosure are excellent in dielectric properties, peel strength, thermal expansion rate, moisture-heat resistance, flame retardancy, and processibility.

The difference between Comparative Example 1 and Example 2 is only in the molecular weight distribution of the modified maleimide resin. In Comparative Example 1, the proportion of molecules with a molecular weight between 1,000 and 4500 is relatively low. It can be seen from the above table that the peel strength is poor, the glass transition temperature is low, the moisture-heat resistance is unqualified, and the processibility is unqualified.

The difference between Comparative Example 2 and Example 2 is only in the molecular weight distribution of the modified maleimide resin. In Comparative Example 2, the proportion of molecules with a molecular weight between 1,000 and 4500 is relatively high. It can be seen from the above table that the thermal expansion rate is relatively high, and the processibility is unqualified.

The difference between Comparative Examples 3 and 4 and Example 2 is that, when only diamines containing two primary amines/monoamines with only one primary amine are used to modify maleimide, the proportion of molecules with a molecular weight between 1000 and 4500 of the resultant modified maleimide resin is relatively higher/lower. It can be seen from the above table that the dielectric properties are poor, and at the same time, the moisture-heat resistance is poor.

The thermosetting resin composition of the present disclosure forms a modified maleimide resin (A) by introducing a group that is highly reactive with epoxy resin into the maleimide resin. In the reaction, the compatibility problem of the maleimide resin and the active ester of the curing agent is solved by using a special solvent and controlling its molecular weight distribution, and the insufficient heat resistance of the system that the active ester is used to cure epoxy resin system is solved at the same time.

In addition, the thermosetting resin composition of the present disclosure avoids the disadvantages of high water absorption rate of ordinary phosphorus-containing flame retardants, reduced resin bonding strength, low flame retardant efficiency and poor dielectric properties by introducing a phosphorus-containing active ester resin having low water absorption as a flame retardant.

The prepreg, the laminate and the metal foil-clad laminate made of the thermosetting resin composition have the advantages of high glass transition temperature, low dielectric constant, low dielectric loss and low water absorption, low coefficient of thermal expansion, high flame retardancy and high bondability with conductors.

Obviously, those skilled in the art can make various changes and modifications to the examples of the present disclosure without departing from the spirit and scope of the present disclosure. In this way, if these modifications and variations of the present disclosure fall within the scope of the claims of the present disclosure and equivalent technologies, the present disclosure also intends to include these modifications and variations.

What is claimed is:

1. A resin composition, comprising:
a modified maleimide resin obtained by means of reacting a maleimide compound having at least two maleimide groups/molecules with an amine compound having at least one primary amine group/molecule and an amine compound having at least two primary amine groups/molecules, and has the molecular weight distribution that molecules having a molecular weight between 1000 and 4500 account for 30-50% of the total number of molecules,
an active ester resin, and
an epoxy resin.

2. The resin composition according to claim 1, wherein the maleimide compound having at least two maleimide groups/molecules is a compound represented by the Formula (M-1),

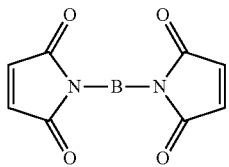
(M-1)

wherein, B is

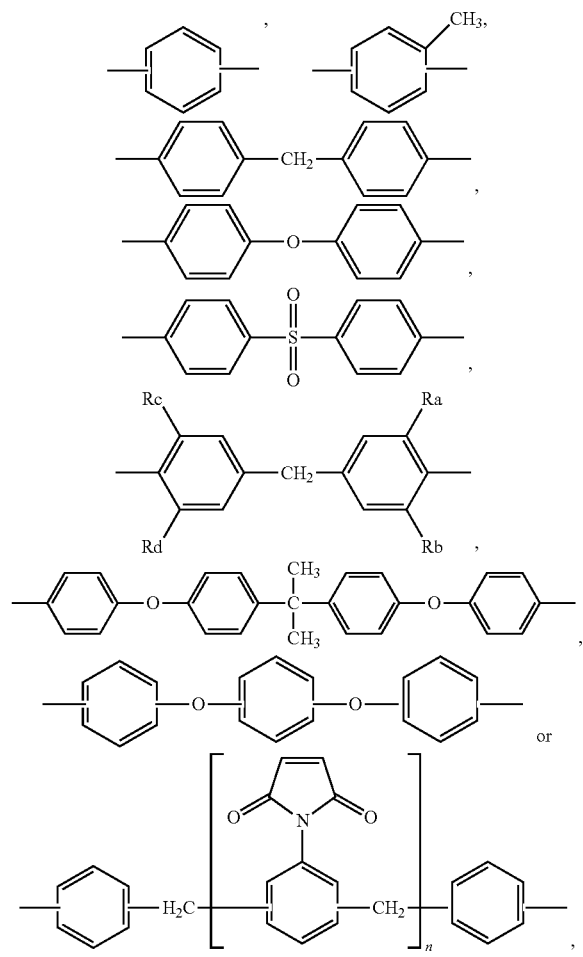

wherein, $R_a$, $R_b$, $R_c$ and $R_d$ are each independently methyl, ethyl, propyl and isopropyl; and n is an integer from 1 to 3.

3. The resin composition according to claim 2, wherein the compound represented by the Formula (M-1) is 2,2-bis(4-(4-maleimidophenoxy)-phenyl)propane, bis(3,5-dimethyl-4-maleimidophenyl)methane, bis(3-ethyl-5-methyl-4-maleimidophenyl)methane and bis(3,5-diethyl-4-maleimidophenyl)methane.

4. The resin composition according to claim 1, wherein the amine compound having at least one primary amine group/molecule is a compound represented by the Formula (N-1),

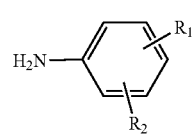
(N-1)

wherein $R_1$ represents a hydrogen atom or an alkyl group having a carbon number of 1 to 3; and $R_2$ represents an acid group.

5. The resin composition according to claim 4, wherein the compound represented by the Formula (N-1) is p-aminophenol.

6. The resin composition according to claim 1, wherein the amine compound having at least two primary amine groups/molecules is a compound represented by the Formula (N-2),

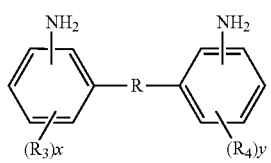
(N-2)

wherein R represents an aliphatic hydrocarbon group with a carbon number of 1 to 5, —O—,

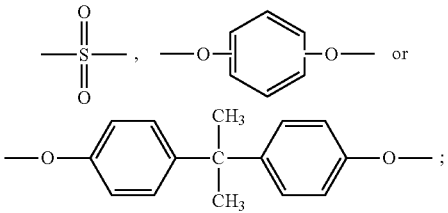

$R_3$ and $R_4$ each independently represent a hydrogen atom, an alkyl group having a carbon number of 1 to 3, a halogen atom, a hydroxyl group, a carboxyl group or a sulfonic acid group; and x and y are each independently an integer from 0 to 4.

7. The resin composition according to claim 6, wherein the compound represented by the Formula (N-2) is 4,4'-diaminodiphenyl ether, 2,2-bis(4-(4-aminophenoxy)-phenyl) propane, 4,4'-diamino-3,3'-dimethyldiphenylmethane, 4,4'-diamino-3,3'-diethyldiphenylmethane or 4,4'-diamino-3,3'-diethyl-5,5'-dimethyldiphenylmethane.

8. The resin composition according to claim 1, wherein the active ester resin is selected from a compound represented by the Formula (AR-1) or (AR-2), or a combination thereof,

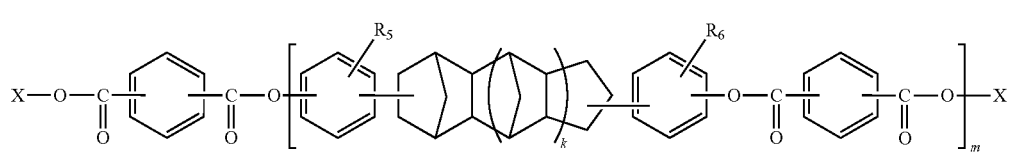
(AR-1)

in the Formula (AR-1), X is a benzene ring or a naphthalene ring; $R_5$ and $R_6$ are each independently methyl group or hydrogen atom; k is 0 or 1; and m has an equivalent between 0.2 and 2;

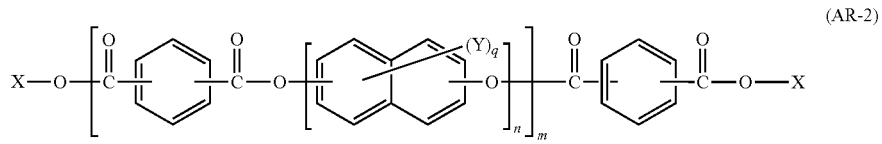
(AR-2)

in the Formula (AR-2), X is a benzene ring or a naphthalene ring; Y in $(Y)_q$ is independently a methyl group, a hydrogen atom or an ester group; q is an integer from 1 to 3; n is an integer from 1 to 10; and m is an integer from 1 to 10.

9. The resin composition according to claim 1, wherein the epoxy resin is selected from an epoxy resin containing at least two epoxy groups.

10. The resin composition according to claim 1, wherein the epoxy resin is a linear novolac epoxy resin, a cresol novolac epoxy resin, a naphthalene epoxy resin, a naphthol epoxy resin, a naphthalene phenolic epoxy resin, a biphenyl epoxy resin, a dicyclopentadiene epoxy resin, a dicyclopentadiene novolac epoxy resin, an aralkyl epoxy resin, an aralkyl novolac epoxy resin, an epoxy resin containing arylene ether structure, or a mixture thereof.

11. The resin composition according to claim 1, wherein the resin composition further comprises a flame retardant, an inorganic filler, or a combination thereof.

12. The resin composition according to claim 1, wherein the modified maleimide resin is in an amount of 10 to 70 parts by weight, based on the total weight of the modified maleimide resin, the active ester resin and the epoxy resin as 100 parts by weight.

13. The resin composition according to claim 1, wherein the active ester resin is in an amount of 5-50 parts by weight, based on the total weight of the modified maleimide resin, the active ester resin and the epoxy resin as 100 parts by weight.

14. The resin composition according to claim 1, wherein the epoxy resin is in an amount of 10-60 parts by weight, based on the total weight of the modified maleimide resin, the active ester resin and the epoxy resin as 100 parts by weight.

15. A prepreg obtained by impregnating or coating a base material with the resin composition according to claim 1 and curing.

16. A laminate comprising at least one prepreg according to claim 15.

17. A metal foil-clad laminate comprising at least one prepreg according to claim 15 and metal foils covering one or both sides of the prepreg.

18. A printed circuit board comprising at least one prepreg according to claim 15.

* * * * *